(12) United States Patent
Kok

(10) Patent No.: US 9,891,532 B2
(45) Date of Patent: *Feb. 13, 2018

(54) LITHOGRAPHIC METHOD TO APPLY A PATTERN TO A SUBSTRATE AND LITHOGRAPHIC APPARATUS

(71) Applicant: ASML Netherlands B.V., Veldhoven (NL)

(72) Inventor: Haico Victor Kok, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/240,357

(22) Filed: Aug. 18, 2016

(65) Prior Publication Data

US 2016/0357115 A1 Dec. 8, 2016

Related U.S. Application Data

(63) Continuation of application No. 14/301,572, filed on Jun. 11, 2014, now Pat. No. 9,423,688, which is a
(Continued)

(51) Int. Cl.
  *G03B 27/68* (2006.01)
  *G03B 27/52* (2006.01)
  (Continued)

(52) U.S. Cl.
  CPC ........ *G03F 7/70141* (2013.01); *G03F 7/0002* (2013.01); *G03F 7/70258* (2013.01);
  (Continued)

(58) Field of Classification Search
  CPC ............ G03F 7/70141; G03F 7/0002; G03F 7/70258; G03F 7/70308; G03F 7/70358; G03F 7/70783
  See application file for complete search history.

(56) References Cited

U.S. PATENT DOCUMENTS

| 5,581,324 A | 12/1996 | Miyai et al. |
| 6,235,438 B1 | 5/2001 | Suzuki et al. |
(Continued)

FOREIGN PATENT DOCUMENTS

| JP | H 08-264431 A | 10/1996 |
| JP | H 10-149980 A | 6/1998 |
(Continued)

OTHER PUBLICATIONS

English-Language Abstract for Japanese Patent Publication No. 11-195602 A, published Jul. 21, 1999; 1 page.
(Continued)

*Primary Examiner* — Deoram Persaud
(74) *Attorney, Agent, or Firm* — Sterne, Kessler, Goldstein & Fox P.L.L.C.

(57) ABSTRACT

A slit shaped area of a patterning device is illuminated to impart a radiation beam with a pattern in its cross-section. A projection system projects the patterned radiation beam onto a target portion of a substrate. As the radiation beam is scanned across the target portion of the substrate, a configuration of the projection system is adjusted and applies a pattern to the target portion. The adjusting may affect a magnitude of an image magnification component of the projection system, along the length of the slit shaped area, or an image distortion in a scan direction. The adjusting is arranged to compensate an effect on pattern overlay accuracy of a distortion of the patterning device.

4 Claims, 9 Drawing Sheets

Related U.S. Application Data continuation of application No. 13/874,917, filed on May 1, 2013, now Pat. No. 8,760,620, which is a continuation of application No. 12/390,552, filed on Feb. 23, 2009, now Pat. No. 8,436,977.

(60) Provisional application No. 61/064,281, filed on Feb. 26, 2008.

(51) Int. Cl.
*G03F 7/20* (2006.01)
*G03F 7/00* (2006.01)

(52) U.S. Cl.
CPC ...... *G03F 7/70308* (2013.01); *G03F 7/70358* (2013.01); *G03F 7/70783* (2013.01)

(56) References Cited

U.S. PATENT DOCUMENTS

| | | | |
|---|---|---|---|
| 6,416,913 | B1 | 7/2002 | Suzuki |
| 8,436,977 | B2 | 5/2013 | Kok |
| 8,760,620 | B2 | 6/2014 | Kok |
| 9,423,688 | B2 | 8/2016 | Kok |
| 2002/0012109 | A1 | 1/2002 | Suzuki et al. |
| 2002/0171815 | A1 | 11/2002 | Matsuyama et al. |
| 2003/0035090 | A1 | 2/2003 | Imai et al. |
| 2003/0128344 | A1 | 7/2003 | Nishi |
| 2003/0174298 | A1 | 9/2003 | Yoshimura |
| 2008/0192224 | A1 | 8/2008 | Gruner et al. |
| 2009/0213351 | A1 | 8/2009 | Kok |
| 2010/0092881 | A1 | 4/2010 | Mos et al. |
| 2010/0225889 | A1 | 9/2010 | Sumiyoshi |
| 2013/0235360 | A1 | 9/2013 | Kok |
| 2014/0293261 | A1 | 10/2014 | Kok |

FOREIGN PATENT DOCUMENTS

| | | |
|---|---|---|
| JP | H 11-102860 A | 4/1999 |
| JP | H 11-121372 A | 4/1999 |
| JP | H 11-195602 A | 7/1999 |
| JP | 2001-230192 A | 8/2001 |
| JP | 2003-133223 A | 5/2003 |
| JP | 2003-273007 A | 9/2003 |

OTHER PUBLICATIONS

English-Language Translation of Notice of Reason(s) for Refusal directed to related Japanese Patent Application No. 2009-039850, dated Jun. 28, 2011, from the Japanese Patent Office; 3 pages.
Non-Final Rejection dated Dec. 7, 2011 for U.S. Appl. No. 12/390,552, filed Feb. 23, 2009; 8 pages.
Final Rejection dated Feb. 29, 2012 for U.S. Appl. No. 12/390,552, filed Feb. 23, 2009; 10 pages.
Non-Final Rejection dated Jun. 19, 2012 for U.S. Appl. No. 12/390,552, filed Feb. 23, 2009; 10 pages.
Notice of Allowance dated Jan. 7, 2013 for U.S. Appl. No. 12/390,552, filed Feb. 23, 2009; 11 pages.
Non-Final Rejection dated Sep. 4, 2013 for U.S. Appl. No. 13/874,917, filed May 1, 2013; 7 pages.
Notice of Allowance dated Feb. 21, 2014 for U.S. Appl. No. 13/874,917, filed May 1, 2013; 12 pages.
Non-Final Rejection dated Sep. 9, 2015 for U.S. Appl. No. 14/301,572, filed Jun. 11, 2014; 7 pages.
Notice of Allowance dated Feb. 1, 2016 for U.S. Appl. No. 14/301,572, filed Jun. 11, 2014; 9 pages.
Notice of Allowance dated Apr. 28, 2016 for U.S. Appl. No. 14/301,572, filed Jun. 11, 2014; 10 pages.

LITHOGRAPHIC METHOD TO APPLY A PATTERN TO A SUBSTRATE AND LITHOGRAPHIC APPARATUS

This application incorporates by reference in their entireties U.S. patent application Ser. No. 14/301,572, U.S. patent application Ser. No. 13/874,917, U.S. patent application Ser. No. 12/390,552 and U.S. provisional application 61/064,281.

BACKGROUND

Field of Invention

The present invention relates to a lithographic apparatus and method.

Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

When a radiation beam is incident upon the patterning device, the patterning device is heated by the radiation beam. For example, heating may occur due to absorption of some of the energy of the radiation beam into the patterning device. Heating of the patterning device can lead to expansion of the patterning device. If the expansion of the patterning device is not taken into account, a pattern may be incorrectly applied to the substrate. For instance, overlaid patterns applied to the substrate may not totally overlap with one another, such that there is an overlay error between successively applied patterns. This may occur due to the patterning device having a different temperature (and therefore having a different degree of expansion) for each successive exposure. In known arrangements, the expansion of the patterning device may be taken into account by providing the patterning device with alignment marks. For instance, the alignment marks may be located in or around an area of the patterning device which defines an image field. By detecting changes in the positions of the alignment marks, the degree of expansion of the patterning device, and in particular the image field, can be determined. Elements of the lithographic apparatus, for example lenses of a projection system of the lithographic apparatus, can be adjusted to compensate for the expansion of the patterning device, thereby ensuring that patterns are correctly applied to the substrate.

In known arrangements, lenses of the projection system are adjusted (e.g. moved) before each exposure. The lenses may be adjusted to take into account a uniform expansion of the patterning device, the adjustment being arranged to provide a correction (i.e., a change) of a magnification factor (or de-magnification factor) of the projection system required to reduce the size of pattern features applied to the substrate to a desired size. During application of the pattern to the substrate (using a static or scanned exposure), the lens elements are not adjusted.

In some known arrangements, the expansion of the patterning device is assumed to be uniform due to it being heated by the radiation beam. In arrangements where the expansion is assumed to be non-uniform, the magnification correction obtained by adjustment of the lenses of, for example, the projection system is uniform (in a plane of the image field) and remains unchanged during an exposure. This means that the adjustment of the lenses of the projection system may not accurately reflect an actual and non-uniform expansion of the patterning device within, for example, an exposure field. This may lead to for example, overlay errors in patterns successively applied to the substrate.

SUMMARY

It is desirable to provide, for example, a lithographic apparatus and method which obviates or mitigates one or more of the problems of the prior art, whether identified herein or elsewhere.

According to an embodiment of the present invention, there is provided a method for applying a pattern to a substrate comprising illuminating a slit shaped area, elongated along a first direction, of a patterning device with a radiation beam to provide a patterned radiation beam, scanning the patterning device through the radiation beam in a scan direction perpendicular to the first direction, imaging the patterned radiation beam onto a target portion of the substrate using a projection system, a characteristic of the projection system being an image magnification component along the first direction, and synchronously scanning the substrate along the scan direction, the method including: applying an adjustment to the image magnification component as the substrate is scanned across a footprint of the radiation beam corresponding to the slit shaped area, a magnitude of the adjustment being a function of a position of the footprint relative to a center of the target portion.

A further characteristic of the projection system may be an image distortion component along the scan direction, and the method may then comprise applying a supplementary adjustment to the image distortion component as the substrate is scanned across the footprint of the radiation beam, a magnitude of the supplementary adjustment being a function of a position of the footprint relative to a center of the target portion.

The magnitude of the adjustment to the image magnification component and/or the magnitude of the supplementary adjustment may be arranged to reduce a distortion of an image field due to heating of the patterning device.

According to an embodiment of the invention, there is provided a lithographic apparatus comprising an illumination system configured to illuminate a slit shaped area, elongated along a first direction, of a patterning device with a radiation beam to provide a patterned radiation beam, a support structure configured to hold the patterning device and move the patterning device along a scan direction, a substrate table configured to hold a substrate and move the substrate synchronously with the support structure along the scan direction, a projection system configured to project the patterned radiation beam onto a target portion of the substrate, a characteristic of the projection system being an image magnification component along the first direction, and a controller configured to apply an adjustment to the image magnification component as the substrate is scanned across a footprint of the radiation beam corresponding to the slit shaped area, a magnitude of the adjustment being a function of a position of the footprint relative to a center of the target portion.

A further characteristic of the projection system may be an image distortion component along the scan direction, and the controller may be configured to apply a supplementary adjustment to the image distortion component as the substrate is scanned across the footprint of the radiation beam, a magnitude of the supplementary adjustment being a function of a position of the footprint relative to a center of the target portion.

BRIEF DESCRIPTION OF THE DRAWINGS

Embodiments of the invention will be described, by way of example only, with reference to the accompanying schematic drawings in which corresponding reference symbols indicate corresponding parts, and in which.

DETAILED DESCRIPTION

Figure 1:
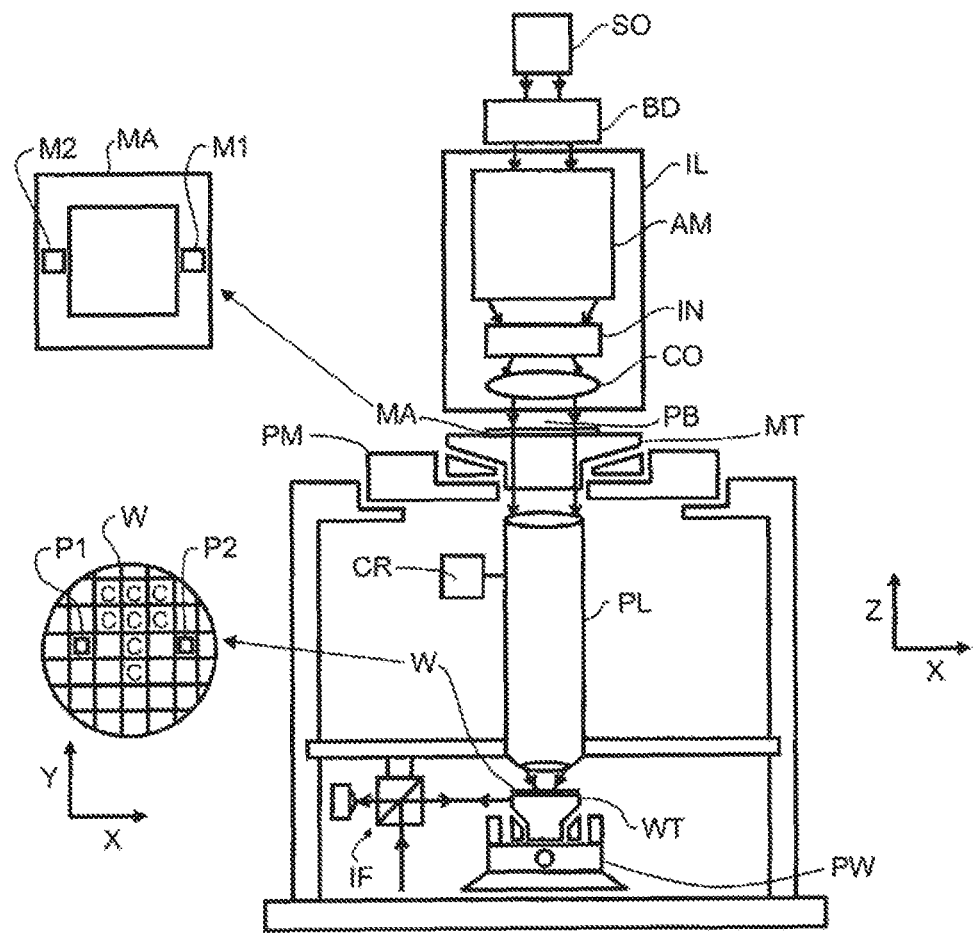
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV, DUV or EUV radiation);

a support structure (e.g. a mask table) MT to support a patterning device (e.g. a mask) MA and connected to first positioning device PM to accurately position the patterning device with respect to item PL;

a substrate table (e.g. a wafer table) WT for holding a substrate (e.g. a resist-coated wafer) W and connected to second positioning device PW for accurately positioning the substrate with respect to item PL;

a projection system (e.g. a refractive projection lens) PL configured to image a pattern imparted to the radiation beam PB by patterning device MA onto a target portion C (e.g. comprising one or more dies) of the substrate W; and a controller CR arranged to control the configuration of the projection system PL (e.g. the position or orientation of one or more elements of the projection system PL).

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

Combinations and/or variations on the above described modes of use may also be employed.

Figure 2:
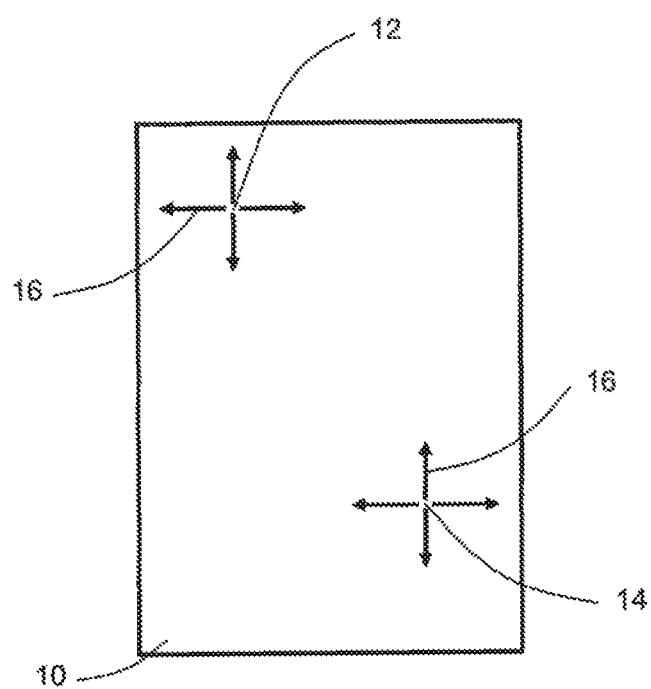
FIG. 2 schematically depicts assumed uniform expansion of different parts of a patterning device.

As mentioned above, irradiation of the patterning device MA may also have the effect of heating the patterning device MA. Heating the patterning device MA may cause the patterning device MA to expand. If expansion of the patterning device MA is not taken into account (or if it is not compensated for), patterns successively applied to a substrate W (e.g. overlaid patterns applied to a target portion of the substrate) may not be positioned accurately relative to one another. There may be what is known in the art as an overlay error between the overlaid patterns. It is known to compensate for a uniform expansion of the patterning device MA in x and y direction prior to each exposure by adjusting elements of the projection system PL (e.g. the position or orientation of lenses within the projection system) to affect the overall magnification of the projection system PL, thereby compensating for the uniform expansion of the patterning device MA. FIG. 2 illustrates an assumption upon which such arrangements and methods for compensating for the expansion of the patterning device MA is based.

FIG. 2 depicts a patterning device 10. In this Figure, the patterning device 10 is a transmissive mask, but the assumption described below is applicable to, for example, any sort of transmissive, reflective, or refractive patterning device. Two areas including area 12 and area 14 of the patterning device 10 are identified. In known methods and apparatus in which the magnification of the projection system is changed to compensate for uniform expansion of the patterning device 10, it is assumed that area 12 and area 14 of the patterning device 10 undergo uniform and common expansion, as indicated by arrows 16. In accordance with this assumption the patterning device 10 (heated by the radiation beam) expands uniformly in all directions. However, the assumption is not correct. The expansion of different areas of a patterning device is not in fact always a uniform and common expansion.

Figure 3A:
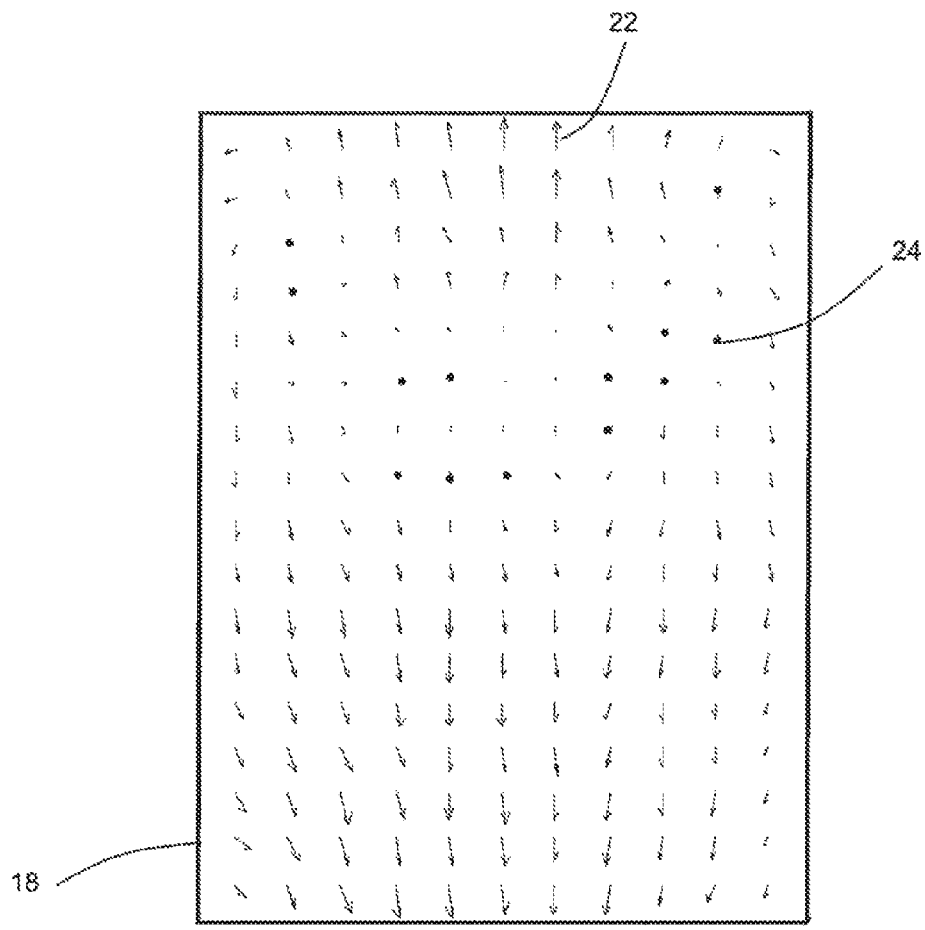
FIGS. 3a and 3b schematically depict overlay errors caused by the expansion of a patterning device for two different field sizes.
Figure 3B:
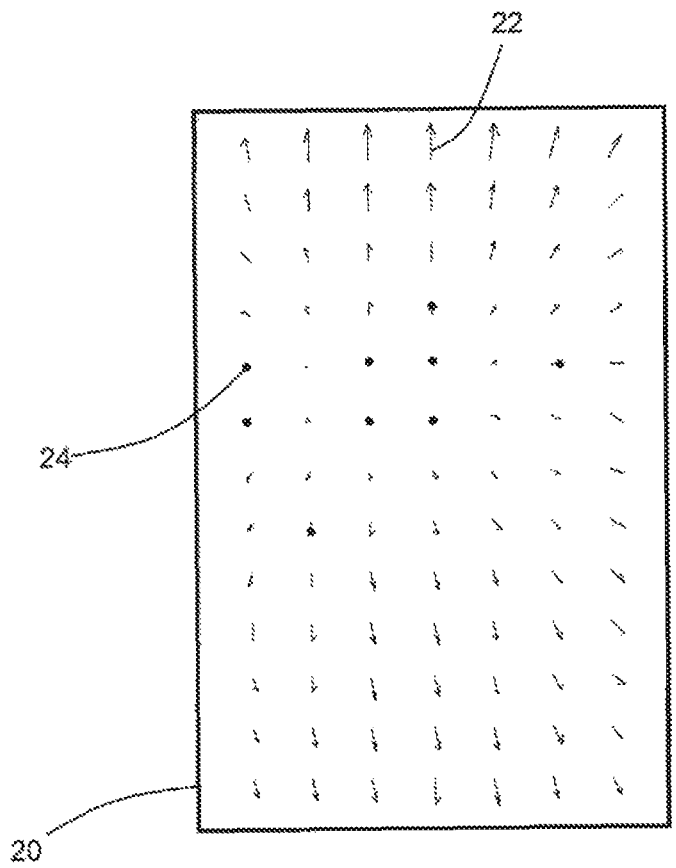

FIGS. 3a and 3b depict overlay errors associated with a pattern applied to a substrate using two fields including field 18 (FIG. 3a) and field 20 (FIG. 3b), respectively, having different field sizes. A field such as field 18 may be referred to hereinafter as an image field.

Field 20 may, hereinafter, also be referred to as an image field, or an exposure field. A field is a portion of the substrate onto which the radiation beam has been projected after it has completed, for example, one scan or static exposure of the pattern on the patterning device, such that the pattern is applied to the substrate. As mentioned above, the target portion may be or may comprise an exposure field. For the present text and claims the concepts field and target portion are equivalent.

The magnitude and direction of the overlay errors are indicated by arrows 22. Dots 24 indicate little or no overlay error.

The arrows 22 representing overlay errors can be explained as representing the relative displacement between patterns (e.g. between corresponding portions of patterns) applied to the substrate using an un-heated patterning device and a heated patterning device respectively. Another way of interpreting FIGS. 3a and 3b is to imagine each arrow 22 representing the magnitude and direction of the expansion of the patterning device in the vicinity of that arrow 22, since this expansion leads to the magnitude and direction of the overlay errors, as represented by the arrows 22.

The overlay errors are not uniformly distributed over the field 18 or 20, as illustrated in FIGS. 3a and 3b, where the arrows 22 schematically represent measured overlay errors. Hence, the expansion of the patterning device is not uniformly distributed over the field 18 or 20. Instead the expansion of the patterning device has a profile in the x,y-plane which has a 'barrel-like' shape (as can be seen from the distribution of the overlay errors near or along the edges of the fields 18 and 20). Consequently, relative to an overlay error at or near the centers (not shown in FIGS. 3a and 3b) of the fields 18, 20, the overlay errors increase along the length and width of the fields 18, 20. The increase along the length of the fields 18, 20 (along the y-axis) differs from the increase across the width of the fields 18, 20 (along the x-axis).

The actual expansion of the patterning device may, hereinafter, also be referred to as the distortion of the patterning device; a corresponding distortion of the field (in the presence of ideal imaging at a directionally uniform de-magnification) is, hereinafter, simply referred to as the distortion. The distortion of the patterning device, and the corresponding effect on overlay errors, is not uniform, but instead has a more complex shape. It will therefore be understood that the known method of compensating for such errors by using a uniform change in the magnification of the projection system of a lithographic apparatus before each exposure will not accurately reflect and therefore compensate for the distortion of the patterning device due to heating of the patterning device.

According to an aspect of the embodiment of the present invention, the configuration of (elements of) the projection system is changed, as, for example, a scanned exposure of the substrate is undertaken. The scanned exposure of the substrate involves illuminating a slit shaped area, elongated along a first direction (e.g., the x-direction in FIGS. 1 and 4), of a patterning device MA with a radiation beam PB to provide a patterned radiation beam, scanning the patterning device MA through the radiation beam in a scan direction perpendicular to the first direction (e.g. the y-direction in FIGS. 1 and 4), and synchronously scanning the substrate W along the scan direction. Because only a slit shaped area is illuminated, imaging the patterned radiation beam onto the target portion of the substrate W using the projection system PL is, at any instant during the scanning, just limited to imaging inside a footprint of the radiation beam corresponding to the slit shaped area. The slit shaped area may for example be a rectangular area, so that the footprint at substrate level is a demagnified rectangular area. Consequently, effects on the imaging of the change of the configuration of the projection system outside the area of the footprint can be ignored, whereas effects on the imaging within the area of the footprint can be dynamically changed to more accurately take into account changes in the expansion of different areas of the patterning device when applying a pattern to a substrate. Dynamically changing effects on imaging refers to applying an adjustment to a characteristic of the projection system as the substrate is scanned across the footprint of the radiation beam, a magnitude of the adjustment being a function of a position of the footprint relative to a center of the target portion or image field. The characteristic of the projection system may be an imaging characteristic such as for example a magnification (or de-magnification) at which the projection system provides an image of a mask pattern or an image aberration (e.g. distortion) which the projection system provides to an image.

This means that changes in the expansion of different areas of the patterning device can be more accurately taken into account when applying a pattern to a substrate. This is in stark contrast to the prior art, where the configuration of the projection system is not adjusted during the application of a pattern to the substrate, but is instead adjusted prior to each exposure.

Figure 4A:
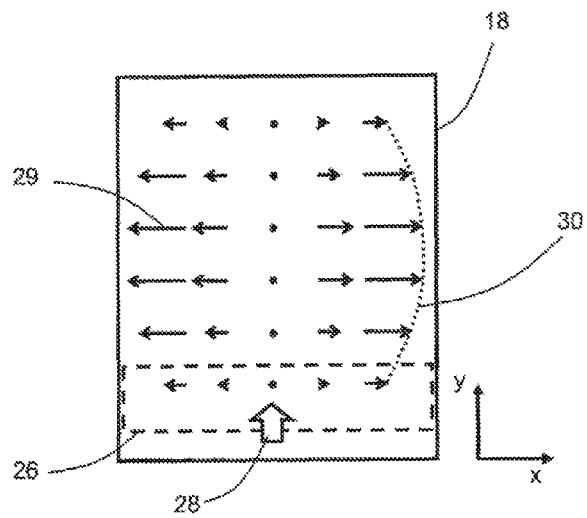
FIGS. 4a and 4b schematically depict decomposition of the expansion of different areas of the substrate into first and second orthogonal components, respectively.
Figure 4B:
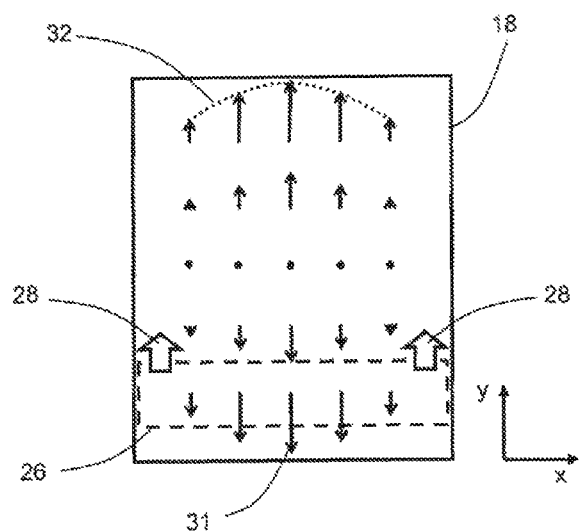

Referring back to FIG. 3a, the arrows 22 were described as being representative of the overlay error associated with the expansion of a patterning device. Referring now to FIGS. 4a and 4b, the distortion of an image field (as a result of a distortion of the patterning device) has been resolved into two orthogonal components. FIG. 4a shows the components of the distortion resolved in the x-direction, whereas FIG. 4b shows the components of the distortion resolved in the y-direction. A footprint of the radiation beam relative to the field 18 is shown in the form of a rectangular slit 26, also referred to hereinafter as a scan slit 26. When used in scan mode, the lithographic apparatus is arranged to scan the slit 26 in the y-direction, as indicated by arrow 28. As known in the art, the patterning device and substrate may be scanned in mutually opposite directions in order to ensure that the slit 26 is scanned across the entire field 18, thus ensuring that an entire pattern is projected onto and therefore applied to the substrate.

As mentioned previously, the distortion of the patterning device (or of the overlay error profile) has a "barrel-like" shape. The x-component 29 of the distortion (as shown in FIG. 4a) may mathematically be described as a first order field effect. For example, the x-component of the distortion may be described as varying linearly with the coordinate x along a line parallel to the x-direction. The rate of change of the x-component of the distortion with respect to a change of the coordinate x is referred to as an x-magnification coefficient or simply an x-magnification. In view of the barrel shape this x-magnification is not constant (but instead, varies) along a line parallel to the y-direction in the field 18.

The y-component 31 of the distortion (as shown in FIG. 4b) may mathematically be described as a second-order field effect. The y-component 31 of the distortion may, for example, be described as varying quadratic with the coordinate x along a line parallel to the x-direction in the field 18. A coefficient weighting the strength of such a quadratic dependence is referred to hereinafter as the y-distortion coefficient. The y-distortion coefficient changes value along a line parallel to the y-direction in the field 18.

As discussed, FIG. 4a schematically depicts the x-component 29 of the distortion. In order to correct for the distortion, a maximum possible distortion occurring in the scan slit 26 needs to be taken into account. For example, one may take into account the maximum possible distortion occurring along a centerline of the scan slit 26 parallel to the x direction. This maximum distortion is $dx_{max}$, and it can be seen that this is a function of the distance $x_e$, in the x-direction across the field 18, between an edge of the scan slit (a vertical edge in FIG. 4a) and a center of the scan slit 26 (not shown in FIG. 4a). In view of aforementioned first-order field effect, $dx_{max}$ can therefore be written as:

$$dx_{max}=M_x \cdot x_e$$

where $M_x$ is the x-magnification coefficient. It will be appreciated that a characteristic of the projection system PL is an image magnification component $M_{PLx}$ along the direction of elongation of the scan slit 26 (the x-direction in FIGS. 4 a and b). According to an aspect of the embodiment, an adjustment to the image magnification component $M_{PLx}$ is applied as the substrate is scanned across the footprint of the radiation beam. For example, an adjustment with a magnitude of the adjustment being $-M_x$ would result in the projection system having an image magnification component $M_{PLx}-M_x$ along the direction of the scan slit 26, and application of the adjustment may reduce or in principle correct for the maximum distortion $dx_{max}$.

It can further be seen that the x-magnification Mx varies in the y-direction as a function of the distance yc, in the y-direction across the field, between a center of the scan slit and a center of the field 18. According to an aspect of the embodiment, the variation in the y-direction may be characterized by a second order dependence of Mx on yc (i.e. by a term including yc2). Consequently, the adjustment to the image magnification component MPLx (with a magnitude of the adjustment being −Mx) is desirably characterized by a second order dependence of Mx on yc as well. Such a second order relationship is denoted in the FIG. 4a by a parabolic curve 30. It can therefore be stated that:

$$M_x=(a \cdot y_c^2)+(b \cdot y_c)+c$$

where a, b and c are constants.

According to an aspect of the embodiment, the method to apply a pattern to the substrate involves, besides applying dynamically an adjustment to the image magnification component MPLx, applying a supplementary adjustment to an image distortion component as the substrate is scanned across the footprint of the radiation beam. It is appreciated that, due to heating of the patterning device, there may be a distortion characterized by y-components 31 as schematically depicted in FIG. 4b. Further, a characteristic (i.e., an adjustable characteristic) of the projection system is an image distortion component along the scan direction. Thus, a supplementary adjustment to the image distortion component as the substrate is scanned can be used to reduce or compensate the y-components 31 of distortion.

FIG. 4b schematically depicts y-components 31 of the distortion. It can be seen that a distortion dy, in the y-direction (occurring in a scan slit 26) is a function of the coordinate x along, for example, a center line (not shown in FIG. 4b) in the scan slit 26. According to an aspect of the embodiment, this function may be characterized by a function of second order in x, including a term x2. This relationship is schematically illustrated as a parabolic curve 32 in the FIG. 4b. It can therefore be stated that:

$$dy=b_{yxx} \cdot (f-x^2)$$

where $b_{yxx}$ is the y-distortion coefficient and f is a constant. The coefficient $b_{yxx}$ is a parameter representative of the distortion in the y-direction. The coefficient $b_{yxx}$ is a measure of the strength of the (quadratic) dependence of the y-component 31 on the coordinate x along a line parallel to the x-direction in the field 18.

The y-distortion coefficient byxx changes value along a line parallel to the y-direction in FIG. 4b. In FIG. 4b it is schematically indicated that the y-distortion coefficient byxx varies as a function of the distance yc in the y-direction. Hence, to reduce or compensate the effect of a distortion of the patterning device having y-components 31, the magnitude of the supplementary adjustment is desirably a function of the position yc of the scan slit 26 (the footprint) relative to a center (not shown in FIG. 4b) of the field 18. According to an aspect of the embodiment, the variation of byxx in the y-direction may be characterized by a first order dependence on yc. It can therefore be stated that:

$$b_{yxx}=(d \cdot y_c)+e$$

where d and e are constants.

It is appreciated that, when a center of the scan slit 26 is located at a y-coordinate $y_c$, the distortion dy includes an offset term f·e (not dependent on $y_c$), a term $d \cdot f \cdot y_c$ linear in $y_c$, and a term $b_{yxx} \cdot x^2$ representing a distortion contribution:

$$dy=f \cdot e+d \cdot f \cdot y_c-b_{yxx}x^2.$$

The offset term represents a uniform pattern shift which may for example be reduced or corrected for by an overlay correction (e.g. a shift of the mask MA). The term linear in $y_c$ accounts for a patterning device expansion, the effect of which can be reduced by applying a y-magnification change $-M_y=-d \cdot f$ to a y-magnification (or reduction factor) $M_{PLy}$ of the projection system. The term $b_{yxx} \cdot x^2$ represents a y-distortion contribution which can be reduced or compensated by applying a distortion change of $+b_{yxx}$ to a corresponding distortion factor $b_{PLyxx}$ (characteristic for second order distortion in x) of the projection system, during scan, in accordance with the coordinate $y_c$, as described above.

Mx and byxx therefore define the (dynamic) magnification and distortion corrections desired as the scan slit 26 is scanned across the field 18 in order to reduce or eliminate overlay errors. It will be appreciated that these corrections may change continuously as the scan slit 26 is scanned across the field 18. The adjustment of the magnification and distortion factors can be effected by appropriate control of the projection system, for example the projection system PL shown in FIG. 1. This is in contrast to known arrangements where such control may be undertaken prior to an exposure, but which are then kept constant during the exposure.

Figure 5:
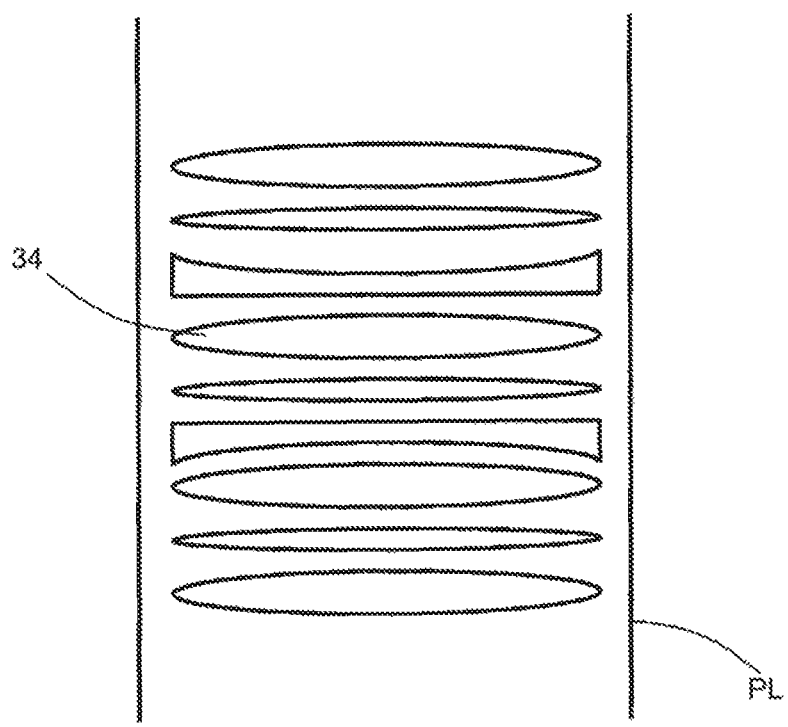
FIG. 5 schematically depicts a part of a projection system.

FIG. 5 is a schematic depiction of a part of a projection system PL according to an embodiment. The projection system PL is shown as comprising a plurality of lenses 34. The position and/or orientation of these lenses 34 can be adjusted to adjust the magnification MPLx or distortion factor bPLyxx. In principle, all the lenses are able to in some way effect the magnification MPLx. Lenses known as 'off-axis lenses' can also be used to take into account the distortion factor byxx. Elements of the projection system PL may therefore be adjusted during scanning of the slit across the patterning device (in other words a scanned exposure of a substrate), therefore taking into account the above-mentioned changes in magnification and/or distortion. The controller CR referred to in FIG. 1 is arranged to control the configuration of the projection system PL (e.g. the position or orientation of one or more optical elements of the projection system PL) in order to take into account a distortion. According to an aspect of the embodiment, the controller CR is arranged to continuously change the configuration of optical elements of the projection system PL during a scanned exposure of the substrate. Alternatively, the controller may be arranged to change the configuration of optical elements in one step or a series of consecutive steps during scanning exposure. Also, continuously changing and stepwise changing can be combined during scanning exposure. The controller CR may be a dedicated piece of equipment, or could be arranged to also perform other tasks. The controller CR could be, for example, a computer, a processor, or an embedded processor. The controller may store, be provided with or be able to retrieve information which allows it to control the configuration of the projection system PL (e.g. the information may be one or more mathematical definitions of the distortion).

Figure 6A:
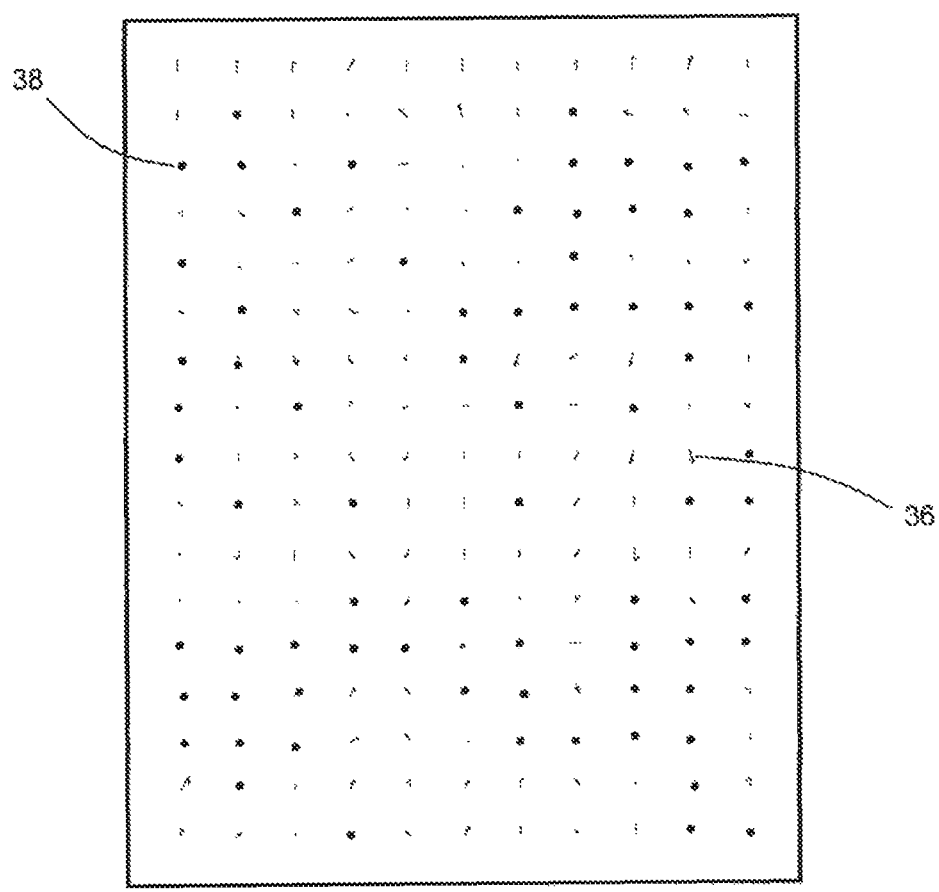
FIGS. 6a and 6b schematically depict overlay errors after a method according to an embodiment of the present invention has been implemented.
Figure 6B:
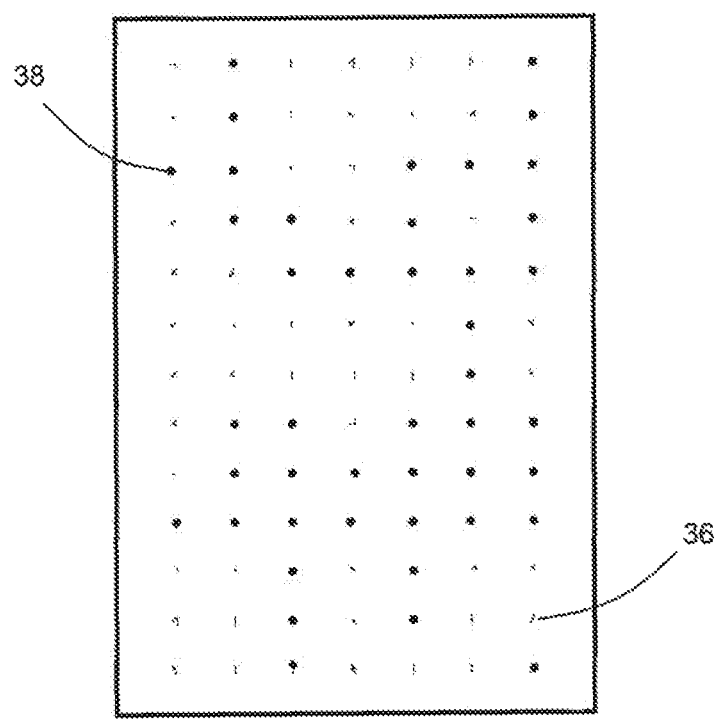

FIGS. 6a and 6b schematically depict the magnitude and direction of residual overlay errors that may result from the method described above, where the configuration of the projection system is adjusted during a scanned exposure to take into account the general distortion of the patterning device. It can be seen in FIGS. 6a and 6b that the distortion (indicated by arrows 36 and dots 38) is greatly reduced in comparison with the distortion where no correction of the projection system is undertaken (as shown in FIGS. 3a and 3b). Dots 38 indicate areas where there is little or no distortion.

It will be appreciated that any type of optical elements may be used to implement the above method of adjusting the configuration of a projection system to take into account distortion of the patterning device. For instance, adjusting of the projection system may involve adjusting the position or orientation of one or more of the following types of optical elements: refractive optical elements, reflective optical elements, catadioptric optical elements, and diffractive optical elements.

Figure 7A:
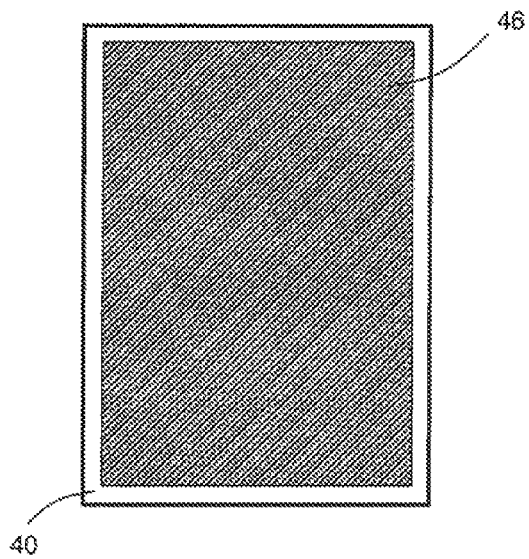
FIGS. 7a to 7c schematically depict various different examples of patterns with which a patterning device may be provided.
Figure 7B:
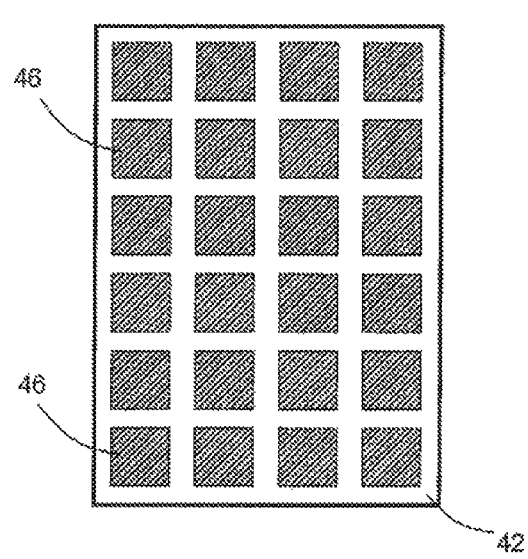
Figure 7C:
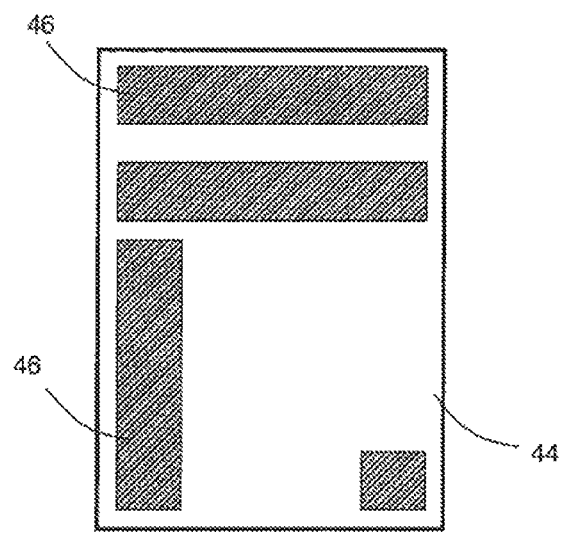

In the above described examples, the distortion has been described as having a "barrel-like" shape. This may often be the case. However, the exact nature of the distortion of, for example, the patterning device, will be dependent upon the pattern provided on or in the patterning device. For instance, FIGS. 7a to 7c depict a plurality of transmissive patterning devices (e.g. masks) 40, 42, 44. It can be seen that each patterning device 40, 42, 44 is provided with opaque regions 46 which are opaque to a radiation beam (and therefore mask out the radiation beam) allowing a pattern to be provided onto a substrate. These opaque regions 46 will absorb some of the energy from the radiation beam and heat up. When the opaque regions 46 heat up, they will expand causing distortion of the patterning device 40, 42, 44 in the region of absorption. However, if the opaque regions 46 are not distributed uniformly across the patterning device 40, 42, 44 (which is often the case) then the absorption of heat, and therefore the expansion of the patterning device will not be uniform. Therefore, a "barrel-like" approximation of the distortion profile may not be particularly accurate. In order to establish a more accurate distortion profile, the position of alignment marks, and the changing of these positions due to distortion of the patterning device will need to be monitored in order to establish an accurate mathematical description of the distortion of the patterning device as a whole. Nevertheless, correcting for a "barrel-like" shaped distortion profile still may correct for a large proportion of the distortion/overlay errors, regardless of the pattern with which the patterning device is provided.

In the above mentioned description, overlay errors have been described as arising from distortion (i.e. expansion) of the patterning device. It will be appreciated that distortion of a pattern applied to a substrate, and subsequent overlay errors when patterns are successively applied to the substrate, may arise from sources of distortion other than expansion of the patterning device. For instance, distortion of the substrate may cause overlay errors to arise, or distortion of the patterning device due to reasons other than heating may cause overlay errors to arise (e.g. bending of the patterning device). As long as the distortion of elements of the lithographic apparatus or the substrate can be detected, the distortions can be combined in order to determine the general distortion for one or more elements of the lithographic apparatus, and/or the substrate, as a whole. The distortion can then be mathematically described, and the projection system can be adjusted during an exposure in accordance with the mathematical description of the distortion in order to account for the distortion of one or more elements of the lithographic apparatus, and/or the substrate, as a whole.

It will be appreciated that the distortion of, for example, the patterning device can be obtained through measurement, simulation, experimentation, or from previous results obtained from the same patterning device (or a similar patterning device from a same batch of patterning devices, for example). Measurements may be made of the patterning device directly or indirectly, for example by measuring actual changes in the position of alignment marks on the patterning device, or by measuring changes in the applied or projected pattern arising due to the use of the patterning device. In the case where the distortion profile is "barrel-like" in shape, it may not be necessary to determine the changes in position of alignment marks within an exposure field or of the patterning device, but only the position of alignment marks around the field or the patterning device. This may mean that fewer alignment marks may be necessary in order to determine the degree of "barrel-like" distortion of the patterning device, meaning that the distortion profile and its mathematical description can be quickly and accurately determined, thereby reducing the effect of determining the position of the alignment marks on the throughput of the lithographic apparatus.

In the foregoing embodiments, the configuration of the projection system has been described as being adjusted as the radiation beam is scanned across or applied to the substrate. This adjustment may be arranged as a continuous adjustment, a stepwise adjustment or a combination of these two types of adjustment. For instance, a mathematical description of the required adjustments of the projection system needed to take into account distortion of, for example, the patterning device may not require or define any adjustment at a part of the exposure field. For instance, a portion of the exposure field may have no overlay errors, and therefore require no adjustment to the projection system. Alternatively, a mathematical description of the adjustments of the projection system used to take into account distortion of, for example, the patterning device may define adjustment at all parts of the exposure field. For instance, all portions of the exposure field may have overlay errors, and therefore may require adjustment to the projection system to reduce or compensate for those errors.

In the foregoing embodiments, mathematical descriptions of the magnification and distortion have been given. In general, the x-magnification Mx can be a function g(yc) of the distance moved in the y-direction of an order higher than second order in yc. The distortion byxx can be a function h(yc) of the distance moved in the y-direction of an order higher than first order in $y_c$. Thus, one can write:

$$M_x = g(y_c)$$

$$b_{yxx} = h(y_c)$$

where $g(y_c)$ and $h(y_c)$ can be, for example, a polynomial of degree n and m respectively, with n>2 and m>1. It will also be appreciated that elements of the projection system may be changed to a different configuration to take into account reduction or compensation of distortions associated with the x-magnification $M_x$ or the y-distortion coefficient $b_{yxx}$. However, other or additional distortion effects can be taken into account. For example, the x-component 29 of the distortion (as shown in FIG. 4a) may mathematically be described as a field-effect of an order higher than first-order. Such a distortion may be present due to heating of the patterning device, and can potentially be corrected by changing the configuration of the projection system. For example the configuration can be controlled to take into account a distortion $dx_{max}$ consisting of or including a term $D3 \cdot x_e^3$, (i.e. correct for or reduce a distortion known in lithography as "D3", where $dx = D3 \cdot x^3$.

In the foregoing embodiments, the radiation beam has been described as being scanned across the substrate. This may be achieved by moving (or scanning) the radiation beam relative to the substrate, or moving (or scanning) the substrate relative to the radiation beam.

While specific embodiments of the invention have been described above, it will be appreciated that the invention may be practiced otherwise than as described. The description is not intended to limit the invention.

What is claimed:

1. A lithographic method to apply a pattern to a substrate comprising:
   illuminating a slit shaped area, elongated along a first direction, of a patterning device with a radiation beam to provide a patterned radiation beam;
   scanning the patterning device through the radiation beam in a scan direction perpendicular to the first direction;
   imaging the patterned radiation beam onto a target portion of the substrate using a projection system, a characteristic of the projection system being an image magnification component along the first direction, and an image distortion component along the scan direction;
   synchronously scanning the substrate along the scan direction;
   applying an adjustment to the image magnification component as the substrate is scanned across a footprint of the radiation beam corresponding to the slit shaped area, the adjustment being a function of a distance in the scan direction between a center of the footprint of the radiation beam corresponding to the slit shaped area and a center of the target portion; and
   applying a supplementary adjustment to the image distortion component as the substrate is scanned across the footprint of the radiation beam, the supplementary adjustment being a function of a distance in the first direction between the center of the footprint of the radiation beam and the center of the target portion.

2. The method of claim 1, wherein the adjustment is determined by combining the distance in the first direction between the center of the footprint and the center of the target portion and the square of the distance in the scan direction between the center of the footprint and the center of the target portion.

3. The method of claim 2, wherein the supplementary adjustment is determined by combining the distance in the scan direction between the center of the footprint and the center of the target portion and the square of the distance in the first direction between the center of the footprint and the center of the target portion.

4. The method of claim 1, wherein the supplementary adjustment is determined by combining the distance in the scan direction between the center of the footprint and the center of the target portion and the square of the distance in the first direction between the center of the footprint and the center of the target portion.

* * * * *